United States Patent
Ramalingam et al.

(10) Patent No.: US 10,388,532 B2
(45) Date of Patent: Aug. 20, 2019

(54) METHODS AND DEVICES USING PVD RUTHENIUM

(71) Applicant: Applied Materials, Inc., Santa Clara, CA (US)

(72) Inventors: Jothilingam Ramalingam, Sunnyvale, CA (US); Ross Marshall, Campbell, CA (US); Jianxin Lei, Fremont, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/718,412

(22) Filed: Sep. 28, 2017

(65) Prior Publication Data

US 2018/0096852 A1   Apr. 5, 2018

Related U.S. Application Data

(60) Provisional application No. 62/403,694, filed on Oct. 3, 2016.

(51) Int. Cl.
*H01L 21/285* (2006.01)
*H01L 29/49* (2006.01)
(Continued)

(52) U.S. Cl.
CPC ........ *H01L 21/28518* (2013.01); *C23C 14/14* (2013.01); *C23C 14/185* (2013.01);
(Continued)

(58) Field of Classification Search
CPC ............. H01L 21/6833; H01L 21/6831; H01L 21/2855; H01L 21/02266; C23C 14/50; C23C 14/34
See application file for complete search history.

(56) References Cited

U.S. PATENT DOCUMENTS 5,801,915 A * 9/1998 Kholodenko ..... C23C 16/45521
279/128
6,104,596 A * 8/2000 Hausmann .......... H01L 21/6833
279/128
(Continued)

FOREIGN PATENT DOCUMENTS

KR   100971803 B1   7/2010

OTHER PUBLICATIONS

PCT International Search Report and Written Opinion in PCT/US2017/054766 dated Jan. 17, 2018, 12 pages.
(Continued)

*Primary Examiner* — Matthew L Reames
*Assistant Examiner* — John A Bodnar
(74) *Attorney, Agent, or Firm* — Servilla Whitney LLC

(57) ABSTRACT

Ruthenium containing gate stacks and methods of forming ruthenium containing gate stacks are described. The ruthenium containing gate stack comprises a polysilicon layer on a substrate; a silicide layer on the polysilicon layer; a barrier layer on the silicide layer; a ruthenium layer on the barrier layer; and a spacer layer comprising a nitride on sides of the ruthenium layer, wherein the ruthenium layer comprises substantially no ruthenium nitride after formation of the spacer layer. Forming the ruthenium layer comprises sputtering the ruthenium in a krypton environment on a high current electrostatic chuck comprising a high resistivity ceramic material. The sputtered ruthenium layer is annealed at a temperature greater than or equal to about 500° C.

20 Claims, 2 Drawing Sheets

(51) Int. Cl.
| | |
|---|---|
| *H01L 21/02* | (2006.01) |
| *H01L 29/66* | (2006.01) |
| *H01L 21/786* | (2006.01) |
| *H01L 29/78* | (2006.01) |
| *C23C 14/14* | (2006.01) |
| *C23C 14/58* | (2006.01) |
| *C23C 14/50* | (2006.01) |
| *C23C 14/34* | (2006.01) |
| *H01L 21/768* | (2006.01) |
| *C23C 14/18* | (2006.01) |
| *C23C 14/35* | (2006.01) |
| *H01L 21/683* | (2006.01) |

(52) U.S. Cl.
CPC .............. *C23C 14/34* (2013.01); *C23C 14/35* (2013.01); *C23C 14/50* (2013.01); *C23C 14/5806* (2013.01); *H01L 21/02532* (2013.01); *H01L 21/7685* (2013.01); *H01L 29/4933* (2013.01); *H01L 29/6656* (2013.01); *H01L 29/78* (2013.01); *H01L 21/6833* (2013.01)

(56) References Cited

U.S. PATENT DOCUMENTS

| | | | |
|---|---|---|---|
| 9,437,714 B1* | 9/2016 | Adusumilli | ....... H01L 29/66795 |
| 2003/0113588 A1* | 6/2003 | Uwazumi | ........... C23C 14/0057 |
| | | | 428/832.1 |
| 2007/0045753 A1 | 3/2007 | Pae et al. | |
| 2007/0066013 A1 | 3/2007 | Lim et al. | |
| 2007/0212896 A1* | 9/2007 | Olsen | ................ H01J 37/32082 |
| | | | 438/758 |
| 2007/0235321 A1 | 10/2007 | Cerio, Jr. | |
| 2007/0287255 A1 | 12/2007 | Doyle et al. | |
| 2008/0096336 A1* | 4/2008 | Lim | .................. H01L 21/28097 |
| | | | 438/187 |
| 2012/0266958 A1* | 10/2012 | Aksu | .................. C23C 14/5806 |
| | | | 136/262 |
| 2013/0221420 A1 | 8/2013 | Yang | |

OTHER PUBLICATIONS

PCT International Search Report and Written Opinion in PCT/US2017/054766 dated Apr. 18, 2019, 8 pages.

\* cited by examiner

METHODS AND DEVICES USING PVD RUTHENIUM

CROSS-REFERENCE TO RELATED APPLICATIONS

This application claims priority to U.S. Provisional Application No. 62/403,694, filed Oct. 3, 2016, the entire disclosure of which is hereby incorporated by reference herein.

TECHNICAL FIELD

The present disclosure relates generally to methods and electronic devices incorporating physical vapor deposited (PVD) ruthenium. In particular, the present disclosure related to methods and electronic devices in which PVD Ru layer replaces PVD tungsten to provide lower resistivity films.

BACKGROUND

The continuing miniaturization of semiconductor integrated circuits has forced many conventional structures to change and has required the accompanying need to improve the processes used to create the new structures. A conventional MOS (metal oxide semiconductor) transistor gate structure for larger feature sizes includes a deposited tungsten nitride barrier layer and a tungsten via layer. Sputtering is the generally preferred method of depositing the WN barrier layer and the W via layer. However, tungsten resistivity increases with reduced film thickness, resulting in a decrease in usefulness for future node DRAM in bitline applications.

Therefore, there is a need in the art for films and methods to deposit films with lower bitline resistivity and insensitivity to oxidation.

SUMMARY

One or more embodiments of the disclosure are directed to methods of forming a gate stack. A plasma sputter chamber including a target comprising ruthenium and a pedestal for supporting a substrate to be sputter deposited in opposition to the target is provided. The pedestal comprises a high current electrostatic chuck at a temperature greater than or equal to about 350° C. Krypton is flowed into the chamber and excited into a plasma to deposit a ruthenium layer on the substrate. An anneal chamber is provided and the ruthenium layer on the substrate is annealed at a temperature greater than or equal to about 500° C.

Additional embodiments of the disclosure are directed to gate stacks comprising: a polysilicon layer on a substrate; a silicide layer on the polysilicon layer; a barrier layer on the silicide layer; a ruthenium layer on the barrier layer; and a spacer layer comprising a nitride on sides of the ruthenium layer. The ruthenium layer comprises substantially no ruthenium nitride after formation of the spacer layer.

Further embodiments of the disclosure are directed to methods of forming a gate stack. A polysilicon layer is formed on the substrate. A silicide layer is formed on the polysilicon layer. The silicide layer comprises titanium silicide with a thickness of about 20 Å. A barrier layer is formed on the silicide layer. The barrier layer comprises one or more of TiN, TaN, WN or TiSiN. An optional interface layer is formed on the barrier layer. A PVD Ru layer is deposited on the barrier layer or the optional interface layer. The PVD Ru layer is deposited with the substrate on a high current electrostatic chuck comprising a high resistivity ceramic at a temperature greater than or equal to about 350° C. in a krypton environment. The PVD Ru layer has a thickness in the range of about 100 Å to about 300 Å. The PVD Ru layer is annealed at a temperature greater than or equal to about 500° C. A spacer layer is formed on the sides of the annealed PVD Ru layer. The spacer layer comprises SiN and forms substantially no ruthenium nitride.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

In one or more embodiments of the disclosure, lower resistivity Ru films are deposited with a high temperature bias able electrostatic chuck (ESC). Some embodiments use a Kr sputtered Ru process in a temperature range of about 190° C. to about 550° C. A two-step process may be used in some embodiments to improve the Ru resistivity as well as film surface morphology. With increased process temperatures in the range of 190° C. to about 550° C., the Ru resistivity decreases with increased ESC temperature and annealing at a temperature in the range of about 680° C. to about 900° C. By combining the high temperature Ru process and higher temperature anneal process, a lower resistivity Ru film can be formed as compared to a W film.

Figure 1:
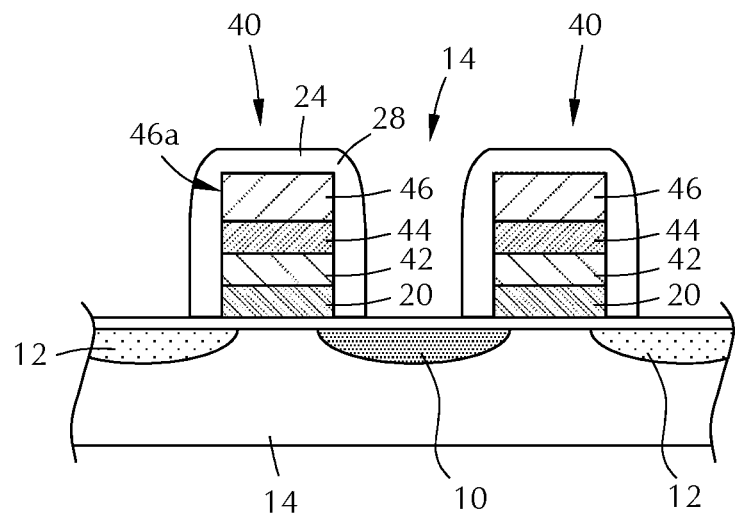
FIG. 1 gas stack in accordance with one or more embodiment of the disclosure.

Referring to FIG. 1, one or more embodiments of the disclosure are directed to a metal oxide semiconductor transistor gate stack 40. The transistor gate stack 40 includes highly doped source/drain (S/D) regions 10, 12 formed into a lesser doped silicon layer substrate 14, which may be formed epitaxially over a silicon wafer or even in a silicon-on-insulator (SOI) structure. A thin gate oxide layer 16 may be formed over the entire MOS area, possibly before the implantation and anneal steps for the S/D regions 10, 12. Gate stacks 40 are formed over the gate oxide layer 16. The gate stack 40 of various embodiments comprises a polysilicon layer 20, a silicide layer 42, a barrier layer 44 and a ruthenium layer 46. An oxide-nitride-oxide (ONO) structure may be sandwiched within the polysilicon layer 20.

Source/Drain holes 26 may be photolithographically etched down to the gate oxide layer 16 over the S/D regions 10, 12 to define the gate stacks 40. Spacers 28, which may be made of silicon oxide can be formed on the sides of the gate stacks 40. The S/D regions 10, 12 may be implanted following the formation of the gate stacks 40 to use the stacks 40 as implant masks.

Subsequent processing steps may open the gate oxide layer 16 at the bottom of the S/D holes 26, provide an ohmic contact layer if necessary, and fill the S/D holes 26 with polysilicon or a metal to electrically contact the S/D regions 10, 12. The cap layer 24 can be removed to provide electrical contact to the top of the gate oxide layer 16 between the S/D regions 10, 12 forming the MOS gate.

The ruthenium layer 46 of various embodiments is formed directly on the barrier layer 44. As used in this regard, the term "directly on" means that there is no interface layer between the ruthenium layer 46 and the barrier layer 44.

One or more embodiment of the disclosure is directed to a gate stack comprising a polysilicon layer 20 on a substrate 14. The polysilicon layer 20 can have an suitable thickness and can be formed by any suitable technique. The polysilicon layer 20 of some embodiments comprises an oxide-nitride-oxide (ONO) structure.

A silicide layer 42 is formed on the polysilicon layer 20. The silicide layer 42 of some embodiments comprises titanium silicide (TiSi). The thickness of the silicide layer 42 can be any suitable thickness. In some embodiments, the silicide layer 42 has a thickness in the range of about 10 Å to about 50 Å, or in the range of about 15 Å to about 40 Å, or in the range of about 20 Å to about 30 Å.

The silicide layer 42 can be formed by any suitable technique or process. For example, the silicide layer 42 can be formed by chemical vapor deposition (CVD), plasma-enhanced chemical vapor deposition (PECVD), atomic layer deposition (ALD), plasma-enhanced atomic layer deposition (PEALD) or physical vapor deposition (PVD).

A barrier layer 44 is formed on the silicide layer 42. The barrier layer can be made from any suitable material and by any suitable technique. In some embodiments, the barrier layer comprises a nitride. In one or more embodiments, the nitride comprises one or more of TiN, TaN, WN or TiSiN.

The thickness of the barrier layer can be any suitable thickness. In some embodiments, the barrier layer 44 has a thickness in the range of about 20 Å to about 200 Å, or in the range of about 30 Å to about 150 Å, or in the range of about 50 Å to about 100 Å.

The barrier layer 44 can be formed by any suitable technique or process. For example, the barrier layer 44 can be formed by chemical vapor deposition (CVD), plasma-enhanced chemical vapor deposition (PECVD), atomic layer deposition (ALD), plasma-enhanced atomic layer deposition (PEALD) or physical vapor deposition (PVD).

A ruthenium layer 46 is formed on the barrier layer 44. The ruthenium layer 46 is formed by physical vapor deposition and may be referred to as a PVD Ru layer. The ruthenium layer 46 can be formed directly on the barrier layer 44 without an interface layer. As used in this regard, an "interface layer" is a separately and intentionally formed layer between the barrier layer 44 and the ruthenium layer 46. In some embodiments, the ruthenium layer 46 is formed on an optional interface layer (not shown).

The ruthenium layer 46 can be formed to any suitable thickness. In some embodiments, the ruthenium layer 46 has a thickness in the range of about 100 Å to about 300 Å, or in the range of about 100 Å to about 200 Å, or in the range of about 150 Å to about 300 Å, or in the range of about 200 Å to about 300 Å.

In some embodiments, forming the ruthenium layer 46 comprises providing a plasma sputter chamber including a target comprising ruthenium and a pedestal for supporting a substrate to be sputter deposited in opposition to the target. The pedestal of some embodiments comprises a high current electrostatic chuck maintained at a temperature greater than or equal to about 350° C. In some embodiments, the electrostatic chuck is maintained at a temperature in the range of about 450° C. to about 550° C. In some embodiments, the high current electrostatic chuck comprises high resistivity ceramic.

The plasma processing gas (e.g., krypton gas) is flowed into the plasma sputter chamber and exited into a plasma. The plasma causes ruthenium atoms to be sputtered from the ruthenium target onto the substrate to deposit the ruthenium layer 46. In some embodiments, the plasma processing gas comprises substantially only krypton. As used in this regard, the term "substantially only" means that the active plasma species is greater than or equal to about 90 atomic % Kr.

Figure 2:
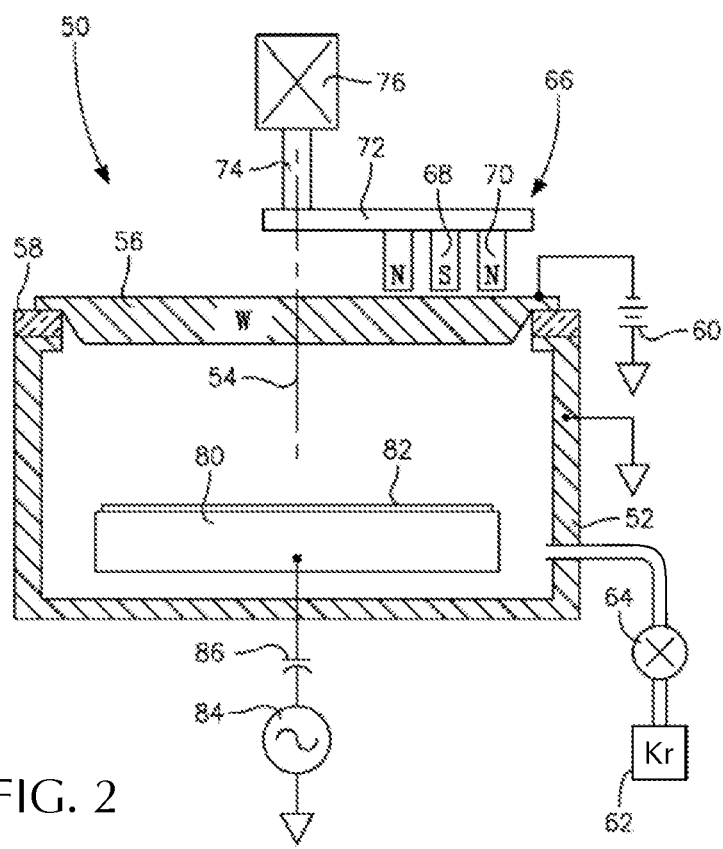
FIG. 2 shows a schematic cross-sectional view of a physical vapor deposition chamber in accordance with one or more embodiment of the disclosure.

An example of a sputter chamber 50 useful for sputtering the ruthenium layer 46 is schematically illustrated in the cross-sectional view of FIG. 2. The sputter chamber 50 includes a vacuum chamber 52 arranged about a central axis 54 on which a ruthenium target 56 is supported through an isolator 58, which vacuum seals the target 56 to the vacuum chamber 52 and electrically isolates the target 56 from the electrically grounded vacuum chamber 52. A vacuum pump system (not shown) pumps the interior of the vacuum chamber 52 to a pressure in the low milliTorr range.

The shape of the front surface of the ruthenium target 56 can be planar or generally concave with thicker outer peripheral edges than inner diameter portions. The ruthenium target 56 includes a layer of ruthenium facing the interior of the vacuum chamber 52 and which typically contains no more than 5 atomic % of elements other than ruthenium to provide a source of sputtered ruthenium.

A DC power source 60 negatively biases the target to about 600 to 1000 VDC with respect to the grounded vacuum chamber 52 or grounded sidewall shield (not shown) to excite a plasma processing gas into a plasma.

Conventionally, argon is the plasma processing gas and is supplied into the vacuum chamber 52 from an argon gas source through a mass flow controller. However, the inventors have found that argon atoms can become embedded in the deposited ruthenium layer 46 and that using a krypton gas source 62 as a plasma processing gas does not result in embedding of the krypton atoms. Therefore, the plasma processing gas of various embodiments comprises, consists essentially of, or consists of krypton. In some embodiments, the plasma processing gas comprises substantially only krypton atoms. The krypton gas source 62 is connected to the vacuum chamber 52 through a mass flow controller 64.

The target power excites the plasma processing gas into a plasma and positively charged ions of the plasma are accelerated towards the target 54 and sputter ruthenium atoms from it. The density of the plasma is increased by placing in back of the target 56 a magnetron 66 having an inner magnetic pole 68 of one magnetic polarity surrounded by an outer magnetic pole 70 of the opposed magnetic polarity. The poles 68, 70 project a magnetic field into the vacuum chamber 52 parallel to the face of the target 56 to trap electrons and hence increase the plasma density and the resultant sputtering rate. To improve the sputtering uniformity and target utilization, the magnetic poles 68, 70 are asymmetric about the central axis 54 but supported on an arm 72 connected to a shaft 74 extending along the central axis 54. A motor 76 rotates the shaft 74 and hence the magnetron 66 about the central axis 54 to provide at least azimuthal uniformity.

A pedestal 80 within the vacuum chamber 52 supports a wafer 82 or other substrate in opposition to the target 56 to be coated with the ruthenium sputtered from the target 56. A wafer is generally planar and circular except for alignment indicia. Optionally, an RF power source 84 biases the pedestal 80 through a capacitive coupling circuit 86. The pedestal 80 is conductive so that it acts as an electrode. The RF bias in the presence of a plasma within the vacuum chamber 52 causes a negative DC self-bias to develop on the pedestal 80 so that sputtered ruthenium ions are accelerated towards the wafer 82 and their trajectories enter deep within any high aspect-ratio holes formed in the wafer 82.

After sputtering the ruthenium layer 46, an anneal chamber is provided to anneal the ruthenium layer 46. The anneal chamber can be any chamber suitable for elevating the temperature of the substrate with the ruthenium layer 46 to a temperature greater than or equal to about 500° C. Suitable annealing chambers include, but are not limited to, thermal processing chambers, rapid thermal annealing (RTA) chambers, spike annealing chambers and laser annealing chamber. In some embodiments, annealing the ruthenium layer occurs at a temperature of about 900° C. for about 30 seconds in a $N_2$ environment. In some embodiments, annealing the ruthenium layer comprises heating the ruthenium layer to about 500° C., increasing the temperature to about 900° C. at a rate greater than or equal to about 50° C./sec, holding the temperature for about 30 seconds and cooling the temperature at a rate equal to or greater than about 70° C./sec.

After formation of the ruthenium layer 46, including annealing, a spacer layer 28 comprising a nitride is formed on the sides 46a of the ruthenium layer 46. The spacer layer 28 of some embodiments comprises SiN. In one or more embodiments, formation of the spacer layer 28 results in the formation of substantially no ruthenium nitride on the sides of the ruthenium layer 46. As used in this manner, "substantially no ruthenium nitride" means that less than about 5% of the width of the ruthenium layer 46 become ruthenium nitride. In some embodiments, less than about 2% of the width of the ruthenium layer 46 becomes ruthenium nitride.

An optional capping layer 24 can be formed on top of the ruthenium layer 46 before, during or after formation of the spacer layer 28. The capping layer 24 can be made of the same material as the spacer layer 28, or can be a different material.

Examples

Figure 3:
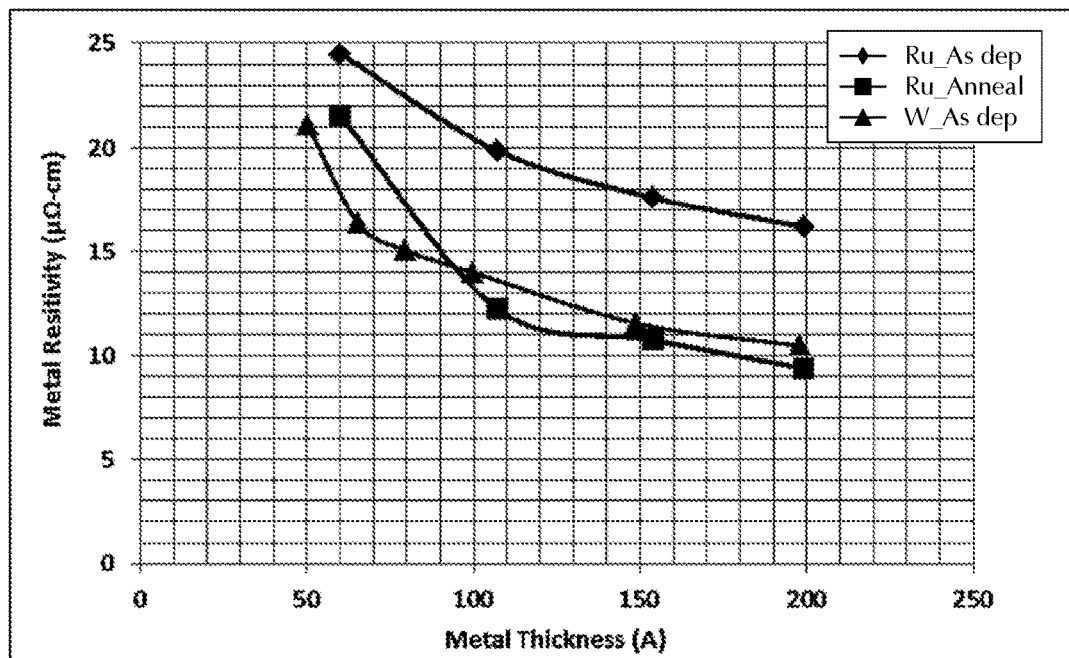
FIG. 3 shows a graph of the metal resistivity for ruthenium and tungsten films as a function of film thickness.

FIG. 3 shows a graph of the metal resistivity ($\mu\Omega$-cm) for as-deposited ruthenium, annealed ruthenium and as-deposited tungsten films as a function of film thickness. The post-annealed ruthenium resistivity was similar to the as-deposited tungsten resistivity. The ruthenium film was annealed at a temperature of about 900° C. for about 30 seconds in a nitrogen environment.

Figure 4:
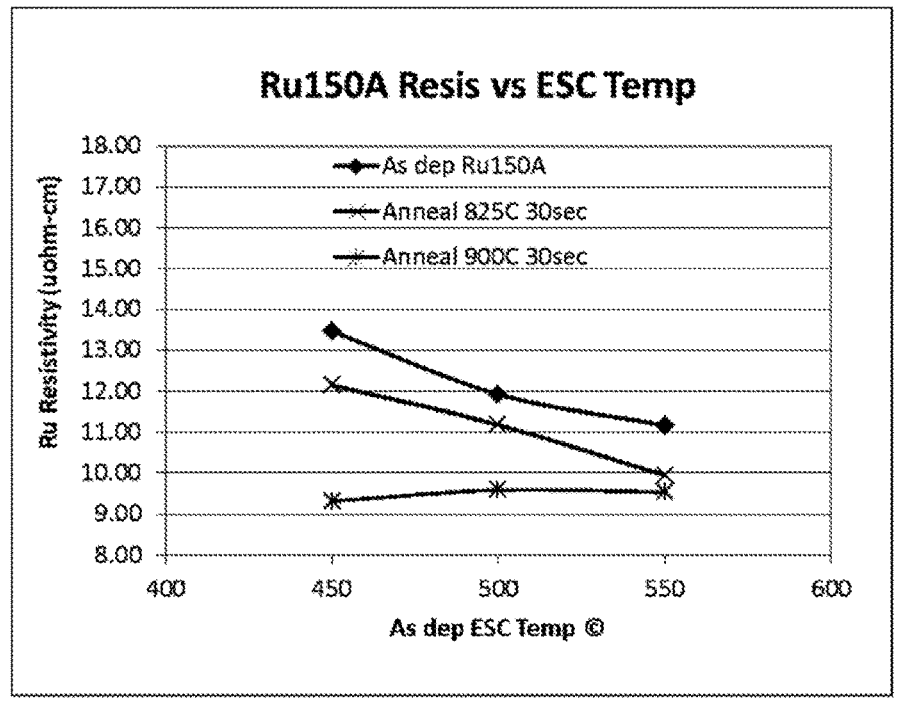
FIG. 4 shows a graph of the resistivity of the ruthenium film as a function of electrostatic chuck temperature.

FIG. 4 shows a graph of the ruthenium resistivity ($\mu\Omega$-cm) for as-deposited ruthenium and annealed ruthenium films. The films were deposited with an electrostatic chuck temperature of about 450° C. and annealed at about 825° C. or 900° C. for about 30 seconds in a nitrogen environment.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of forming a gate stack, the method comprising:
   providing a plasma sputter chamber including a target comprising ruthenium and a pedestal for supporting a substrate to be sputter deposited in opposition to the target, the pedestal comprising a high current electrostatic chuck at a temperature greater than or equal to about 350° C.;
   flowing krypton into the chamber and exciting the krypton into a plasma to deposit a ruthenium layer on the substrate;
   providing an anneal chamber; and
   annealing the ruthenium layer on the substrate at a temperature of about 900° C. for about 30 seconds in a $N_2$ environment.

2. The method of claim 1, wherein the electrostatic chuck is at a temperature in the range of about 450° C. to about 550° C.

3. The method of claim 1, wherein the electrostatic chuck comprises high resistivity ceramic.

4. The method of claim 1, wherein annealing the ruthenium layer comprises heating the ruthenium layer to about 500° C., increasing the temperature to about 900° C. at a rate greater than or equal to about 50° C./sec, holding the temperature for about 30 seconds and cooling the temperature at a rate equal to or greater than about 70° C./sec.

5. The method of claim 1, wherein the ruthenium layer has a thickness in the range of about 100 Å to about 300 Å.

6. The method of claim 1, wherein the ruthenium layer is deposited directly on a barrier layer without an interface layer.

7. The method of claim 6, wherein the barrier layer comprises one or more of TiN, TaN, WN or TiSiN.

8. The method of claim 7, wherein the barrier layer is formed on a silicide layer.

9. The method of claim 8, wherein the silicide layer comprises TiSi with a thickness of about 20 Å.

10. The method of claim 1, further comprising forming a spacer layer on sides of the ruthenium layer, the spacer layer comprising SiN.

11. The method of claim 10, wherein forming the spacer layer forms substantially no ruthenium nitride.

12. A method of forming a gate stack, the method comprising:
    forming a polysilicon layer on a substrate;
    forming a silicide layer on the polysilicon layer, the silicide layer comprising titanium silicide with a thickness of about 20 Å;
    forming a barrier layer on the silicide layer, the barrier layer comprising one or more of TiN, TaN, WN or TiSiN;
    optionally forming an interface layer on the barrier layer;
    depositing a PVD Ru layer on the barrier layer or the optional interface layer, the PVD Ru layer deposited with the substrate on a high current electrostatic chuck comprising a high resistivity ceramic at a temperature greater than or equal to about 350° C. in a krypton environment, the PVD Ru layer having a thickness in the range of about 100 Å to about 300 Å;
    annealing the PVD Ru layer at a temperature greater than or equal to about 500° C.; and
    forming a spacer layer on sides of the annealed PVD Ru layer, the spacer layer comprising SiN and forming substantially no ruthenium nitride.

13. A method of forming a gate stack, the method comprising:
    providing a plasma sputter chamber including a target comprising ruthenium and a pedestal for supporting a substrate with a barrier layer thereon to be sputter deposited in opposition to the target, the pedestal comprising a high current electrostatic chuck at a temperature greater than or equal to about 350° C., the barrier layer comprising one or more of TiN, TaN, WN or TiSiN, the barrier layer formed on a silicide layer;
    flowing krypton into the chamber and exciting the krypton into a plasma to deposit a ruthenium layer on the barrier layer of the substrate without an interface layer;
    providing an anneal chamber; and
    annealing the ruthenium layer on the substrate at a temperature of about 900° C. for about 30 seconds in a $N_2$ environment.

14. The method of claim 13, wherein the electrostatic chuck is at a temperature in the range of about 450° C. to about 550° C.

15. The method of claim 13, wherein the electrostatic chuck comprises high resistivity ceramic.

16. The method of claim 13, wherein annealing the ruthenium layer occurs at a temperature of about 900° C. for about 30 seconds in a $N_2$ environment.

17. The method of claim 13, wherein annealing the ruthenium layer comprises heating the ruthenium layer to about 500° C., increasing the temperature to about 900° C. at a rate greater than or equal to about 50° C./sec, holding the temperature for about 30 seconds and cooling the temperature at a rate equal to or greater than about 70° C./sec.

18. The method of claim 13, wherein the ruthenium layer has a thickness in the range of about 100 Å to about 300 Å.

19. The method of claim 13, wherein the silicide layer comprises TiSi with a thickness of about 20 Å.

20. The method of claim 13, further comprising forming a spacer layer on sides of the ruthenium layer, the spacer layer comprising SiN.

* * * * *